United States Patent
Choi et al.

(10) Patent No.: US 9,742,339 B2
(45) Date of Patent: Aug. 22, 2017

(54) APPARATUS FOR CONTROLLING INVERTER

(71) Applicant: LSIS CO., LTD, Gyeonggi-do (KR)

(72) Inventors: Seung-Cheol Choi, Gyeonggi-do (KR); An-No Yoo, Seoul (KR)

(73) Assignee: LSIS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/927,416

(22) Filed: Oct. 29, 2015

(65) Prior Publication Data

US 2016/0126880 A1    May 5, 2016

(30) Foreign Application Priority Data

Oct. 30, 2014  (KR) .................. 10-2014-0148956

(51) Int. Cl.
| | |
|---|---|
| H02P 1/30 | (2006.01) |
| H02P 1/52 | (2006.01) |
| H02P 3/00 | (2006.01) |
| H02P 7/06 | (2006.01) |
| H02P 27/04 | (2016.01) |
| H02P 27/06 | (2006.01) |
| H02P 1/02 | (2006.01) |
| G01R 19/00 | (2006.01) |
| G01R 31/42 | (2006.01) |
| H02M 5/458 | (2006.01) |
| H02P 21/14 | (2016.01) |

(52) U.S. Cl.
CPC ............. *H02P 27/06* (2013.01); *H02P 1/029* (2013.01); *G01R 19/0092* (2013.01); *G01R 31/42* (2013.01); *H02M 5/458* (2013.01); *H02P 21/14* (2013.01); *H02P 27/04* (2013.01)

(58) Field of Classification Search
CPC ..... H02P 27/04; G01R 19/0092; G01R 31/42; H02M 5/458; H02M 7/003

USPC ........................................................ 318/503
See application file for complete search history.

(56) References Cited

U.S. PATENT DOCUMENTS

| | | | | |
|---|---|---|---|---|
| 5,347,443 | A | * 9/1994 | Muramatsu | ........... H02M 5/458 |
| | | | | 318/778 |
| 2008/0265832 | A1* | 10/2008 | Tan | ........................ H02P 1/029 |
| | | | | 318/802 |
| 2013/0076285 | A1 | 3/2013 | Choi et al. | |

FOREIGN PATENT DOCUMENTS

| | | |
|---|---|---|
| JP | H05268794 A | 10/1993 |
| JP | H0670593 A | 3/1994 |
| JP | H06319291 A | 11/1994 |
| JP | H0888996 A | 4/1996 |
| JP | H0937583 A | 2/1997 |

(Continued)

OTHER PUBLICATIONS

Japanese Office Action dated Aug. 30, 2016 corresponding to application No. 2015-214694.

*Primary Examiner* — Kawing Chan
*Assistant Examiner* — Bradley Brown
(74) *Attorney, Agent, or Firm* — Nath, Goldberg & Meyer; Jerald L. Meyer; Stanley N. Protigal

(57) ABSTRACT

Disclosed herein is an apparatus for controlling an inverter. The apparatus determines the phase of an command voltage in a restart section taking into account the frequency of an input voltage to an electric motor when an input power is reduced below a rated power, the frequency of the input voltage into the electric motor at the time of restarting, a time period for generating a torque, and the phase of the input voltage to the electric motor at the time of the restarting.

7 Claims, 6 Drawing Sheets

(56) References Cited

FOREIGN PATENT DOCUMENTS

| | | | |
|---|---|---|---|
| JP | 2000308393 | A | 11/2000 |
| JP | 2002281795 | A | 9/2002 |
| JP | 2007228662 | A | 9/2007 |
| JP | 2008271751 | A | 11/2008 |
| JP | 2013074792 | A | 4/2013 |
| KR | 20110121519 | A | 11/2011 |

* cited by examiner

PRIOR ART

PRIOR ART

APPARATUS FOR CONTROLLING INVERTER

CROSS REFERENCE TO RELATED APPLICATION

This application claims the benefit of Korean Patent Application No. 10-2014-0148956, filed on Oct. 30, 2014, entitled "APPARATUS FOR CONTROLLING INVERTER", which is hereby incorporated by reference in its entirety into this application

BACKGROUND

1. Technical Field

The present disclosure relates to an apparatus for controlling an inverter.

2. Description of the Related Art

A medium voltage inverter refers to an inverter using an input power greater than 600 $V_{RMS}$ of line voltage, and its rated power capacity ranges from several hundreds of kW to several tens of MW. Medium voltage inverters are commonly used in fans, pumps, compressors, etc. Among such medium voltage inverters, a cascaded multi-level inverter is frequently used, of which output phase-voltages have three or more output voltage levels. The magnitude and the number of output voltage levels of a multi-level inverter are determined depending on the number of power cells thereof. Each of the power cells uses an isolated input voltage.

Typically, a medium voltage electric motor driven by a medium voltage inverter has very high inertia. Accordingly, when an error takes place in an input power or service interruption occurs, it takes long time for the electric motor to completely stop operating for restarting. In order to reduce the time period for restarting, a voltage may be applied according to a voltage/frequency ratio (V/f) during the rotation of the electric motor. However, this may result in a large inrush current to cause malfunction in an inverter or an electric motor.

For this reason, in order to reduce time period for restarting and avoid malfunction in an inverter or an electric motor, a voltage measuring device is employed.

An existing voltage measuring device measures an induced electromotive force of an electric motor in rotation under no control, to learn the voltage and speed information of the electric motor for restarting. When an inverter generates an output, however, the voltage measuring device measures the output from the inverter, and thus can no longer learn the information on the state of the electric motor.

An inverter does not control phase-currents of an electric motor as it is operated according to voltage/frequency. When the frequency of the voltage of an electric motor measured during free rotation is used as an output frequency of an inverter, the amplifier of the current of the electric motor is determined depending on the size of a load.

In the free rotation state of an electric motor, which is triggered as a protective operation against an error in an input power, if the size of a load is small, the amplitude of a generated current is small because the magnitude of the induced electromotive force and reduction in frequency are small, and the slip frequency after voltage for restarting is output is small. However, if the size of the load is large, the amplitude of the generated current is large because the magnitude of the induced electromotive force and the reduction in frequency are large, and the slip frequency after voltage for restarting is output is large.

As such, in the large load condition, the induced electromotive force is largely reduced and thus the magnitude of the available voltage for restarting is small. In addition, a larger current capacity is required due to a larger slip frequency.

SUMMARY

An aspect of the present disclosure is to provide an apparatus for controlling an inverter, which is capable of stably restarting an electric motor by compensating for an output frequency to reduce a current generated by a slip frequency at the time of restarting the electric motor.

In accordance with one aspect of the present disclosure, an apparatus for controlling an inverter employed in an inverter system includes: a first determining unit configured to determine a frequency of an input voltage to an electric motor when an input power is reduced below a rated power, and to determine a magnitude, a phase and a frequency of an input voltage to the electric motor at the time of restarting if the input power is restored; and a second determining unit configured to determine an command voltage to apply it to the inverter in a restart section after the time of restarting until an output voltage from the inverter reaches a predetermined output voltage. The second determining unit is configured to determine a phase of the command voltage based on the frequency of the input voltage to the electric motor when the input power is reduced below the rated power, the frequency of the input voltage to the electric motor at the time of the restarting, a time period required for generating a torque, and the phase of the input voltage to the electric motor at the time of the restarting.

BRIEF DESCRIPTION OF THE DRAWINGS

The above and other aspects, features and advantages of the present invention will become apparent from the following description of exemplary embodiments given in conjunction with the accompanying drawings, in which.

DETAILED DESCRIPTION

As the present disclosure may be variously modified and have several exemplary embodiments, specific exemplary embodiments will be shown in the accompanying drawings and be described in detail in a detailed description. However, it is to be understood that the present disclosure is not limited to the specific exemplary embodiments, but includes all modifications, equivalents, and substitutions included in the spirit and the scope of the present disclosure.

Hereinafter, exemplary embodiments of the present disclosure will be described in detail with reference to the accompanying drawings.

Figure 1:
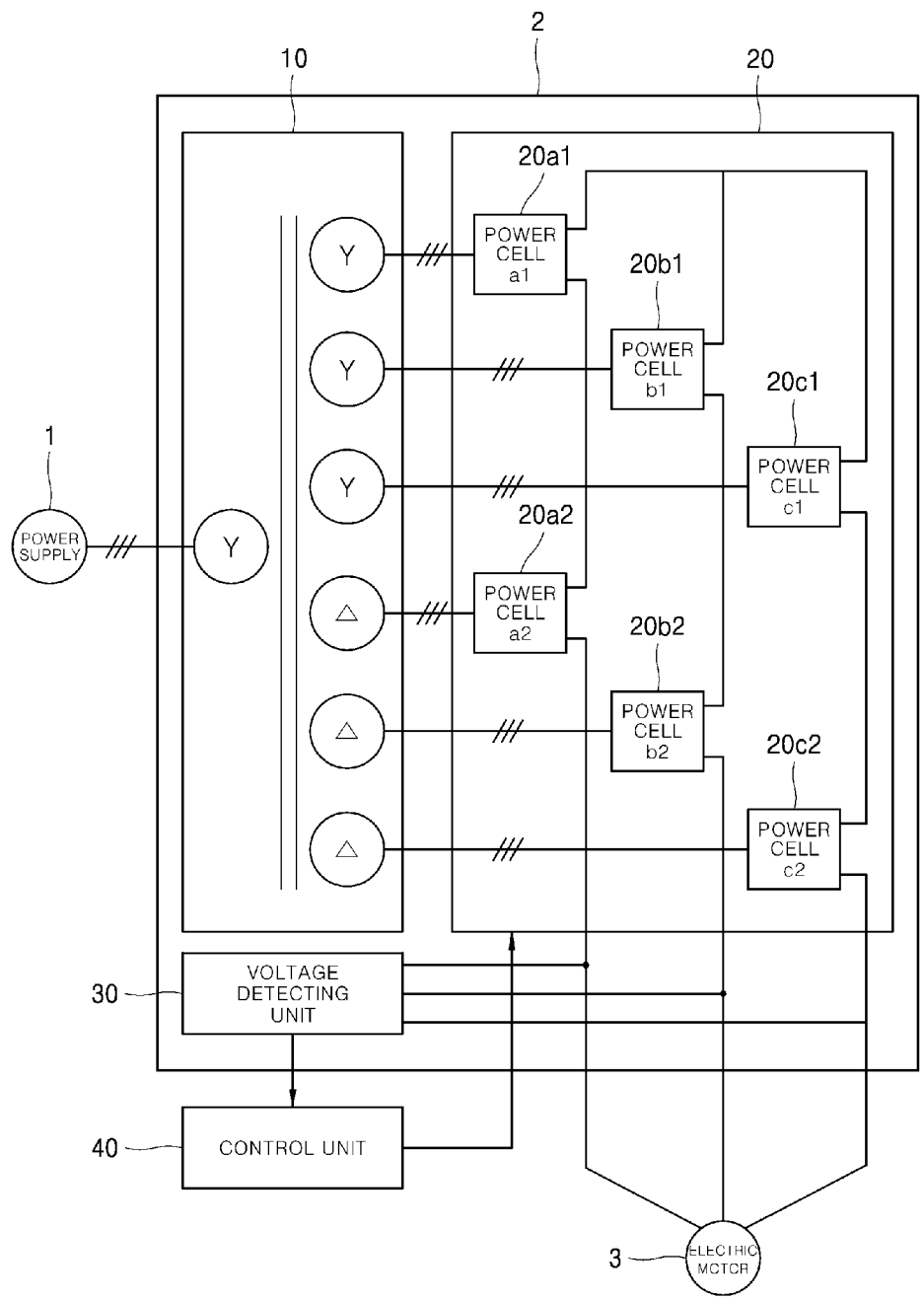
FIG. 1 is a view illustrating an example of a medium voltage inverter system employing an apparatus for controlling an inverter according to an exemplary embodiment of the present disclosure.

FIG. 1 is a view illustrating an example of a medium voltage inverter system employing an apparatus for controlling an inverter according to an exemplary embodiment of the present disclosure.

As shown in FIG. 1, in the system employing the apparatus for controlling an inverter according to an exemplary embodiment of the present disclosure, an inverter 2 is configured to invert a three-phase power having 600 $V_{RMS}$ or greater of line voltage applied from a three-phase power supply 1 and provide it to a medium voltage three-phase electric motor 3. The three-phase electric motor 3 may be, but is not limited to, an induction machine or a synchronous machine.

The inverter 2 may include a phase-shifting transformer 10, a plurality of power cells 20, a voltage detecting unit 30, and a control unit 40.

The phase-shifting transformer 10 may isolate power input from the power supply 1 and may change the phase and magnitude of a voltage as required by the plurality of power cells 20 to provide it to the plurality of power cells 20. By performing such phase shifting, it is possible to improve the total harmonic distortion (THD) of an input current.

The plurality of power cells 20 may receive an output voltage from the phase-shifting transformer 10, and output voltages from the medium voltage inverter 2 may be synthesized by summing outputs from the power cells in respective phases.

That is, in FIG. 1, an output voltage in phase-a from the inverter 2 is the sum of output voltages from power cells 20a1 and 20a2 connected in series, an output voltage in phase-b from the inverter 2 is the sum of output voltages from power cells 20b1 and 20b2 connected in series, and an output voltage in phase-c from the inverter 2 is the sum of output voltages from power cells 20c1 and 20c2 connected in series. Although two power cells are connected in series in FIG. 1 for convenience of illustration, the number of the power cells is not limited to two. Those skilled in the art will appreciate that the number of power cells connected in series may vary depending on the output voltage from the inverter 2. The plurality of power cells has the same configuration. In the following descriptions, the power cells are referred to as "power cells 20" regardless of their phases.

The synthesized output voltages from inverter 2 in the respective phases have the same magnitude but have different phases, each with a phase shift of 120 degrees from the other phases. In addition, it is to be understood that the number of the power cells 20 of the inverter 2 may be increased, and that the THD or the voltage change ratio dv/dt of output voltages applied to the electric motor 3 may be improved by various switching manners.

The voltage detecting unit 30 may detect voltages input to the electric motor 3 in a normal operation state, i.e., output voltages from the inverter 2. The detected output voltages may be used for synchronous bypass, output power calculation and restarting the electric motor 3, etc.

The control unit 40 may be implemented as the apparatus for controlling an inverter according to the exemplary embodiment of the present disclosure. The control unit 40 may receive a voltage from the voltage detecting unit 30 and generate a control signal for controlling the plurality of power cells 20 accordingly. The specific configuration and functionality of the control unit 40 will be described with reference to the drawings below.

Figure 2:
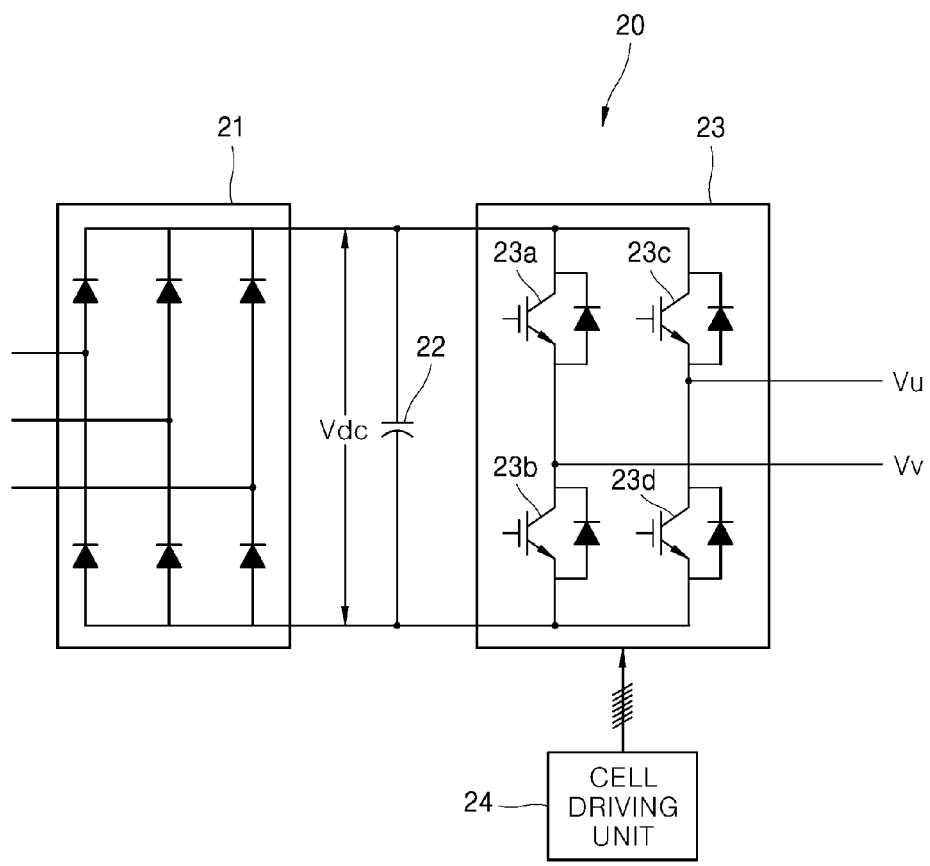
FIG. 2 is a diagram illustrating a specific configuration of one of the power cells shown in FIG. 1.

FIG. 2 is a diagram illustrating a specific configuration of one of the power cells shown in FIG. 1.

As shown in FIG. 2, the power cell 20 employed in the medium voltage inverter system according to an exemplary embodiment of the present disclosure may include a rectifying unit 21, a direct-current (DC) stage capacitor 22, an inverter unit 23 and a cell driving unit 24.

The rectifying unit 21 may include six diodes and may rectify alternating current (AC) voltages input from the phase-shift transformer 10 (in FIG. 10) to DC voltages. The magnitude of the rectified voltage at the DC stage may be determined based on the difference between the input power to the rectifying unit 21 and the output power from the power cell 20. Specifically, the DC stage voltage increases if the input power supplied from the phase-shifting transformer 10 is larger than the output power consumed in a load, and the DC stage voltage decreases otherwise. The DC stage capacitor 22 may absorb the instantaneous power difference between the input stage and the output stage.

The inverter unit 23 configured as a single-phase full bridge inverter, for example, may synthesize output voltages from the DC stage voltage via a plurality of power switches 23a to 23d.

The cell driving unit 24 may be disposed in every power cell 20, and may generate gating signals for determining switching on/off of the power switches 23a to 23d of the inverter unit 23, to provide them to the power switches 23a to 23d of the inverter unit 23. The cell driving unit 24 may be operated according to a control signal from the control unit 40 (in FIG. 1).

In the inverter system thus configured, the control unit 40 may generate an command voltage according to voltage-frequency relationship in a normal operation and provide it to the cell driving units 24. When an input power is instantaneously interrupted and then restored, the control unit 40 may apply a voltage of predetermined magnitude and phase to the power cell 20, thereby restarting the electric motor.

Figure 3:
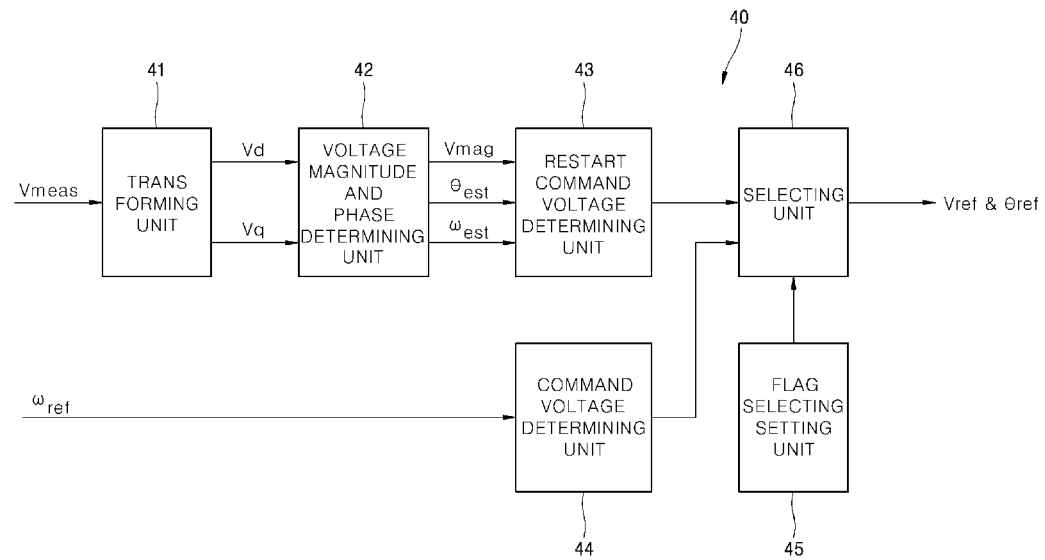
FIG. 3 is a block diagram of an apparatus for controlling an inverter according to an exemplary embodiment of the present disclosure.

FIG. 3 is a block diagram of an apparatus for controlling an inverter according to an exemplary embodiment of the present disclosure, in which a specific configuration of the control unit 40 of FIG. 1 is shown.

As shown in FIG. 3, the control unit 40 may include a transforming unit 41, a voltage magnitude and phase determining unit 42, a restart command voltage determining unit 43, a command voltage determining unit 44, a flag setting unit 45 and a selecting unit 46.

The command voltage determining unit 44 may determine an command voltage according to an command frequency ($\omega_{ref}$). The inverter 2 is driven at a constant ratio between voltage and frequency, and thus a command voltage corresponding to an input command frequency may be determined.

The transforming unit 41 transforms the input voltage to the electric motor 3 detected by the voltage detecting unit 30 (in FIG. 1) into d-axis and q-axis voltage components in the synchronous coordinate system. The voltage magnitude and phase determining unit 42 may detect the magnitude, phase and frequency of the input voltage to the electric motor from the d-axis and q-axis voltage components. Phase detection may be performed by a typical phase loop lock (PLL), etc.

The restart command voltage determining unit 43 may determine a restart command voltage using the magnitude and phase of the voltage input to the electric motor determined by the voltage magnitude and phase determining unit 42.

The flag setting unit 45 may set a flag to 1 when an abnormality occurs in an input power, and may set the flag to 0 when normal operation is possible to provide it to the selecting unit 46.

When a normal input power is received and the flag is set to 1, i.e., in the restart section, the selecting unit 46 may select an command voltage from the restart command voltage determining unit 43 to provide it to the plurality of power cells 20. When the flag is set to 0, the selecting unit 46 may provide a command voltage from the command voltage determining unit 44 to the plurality of power cells 20.

Hereinafter, a way of determining the magnitude and phase of an command voltage in the restart command voltage determining unit of an existing inverter system will be described first, and then that of the restart command voltage determining unit 43 employed in the apparatus for controlling an inverter according to the present disclosure will be described for comparison.

Figure 4:
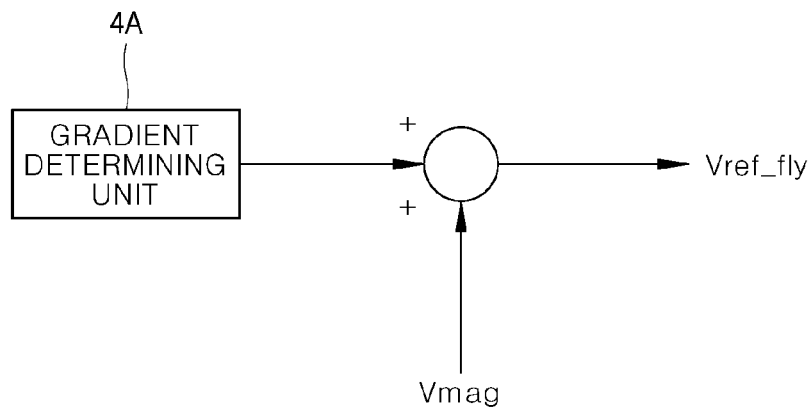
FIGS. 4 and 5 are diagrams for conceptually illustrating a way of determining the amplitude and phase of an command voltage in the prior art.
Figure 5:
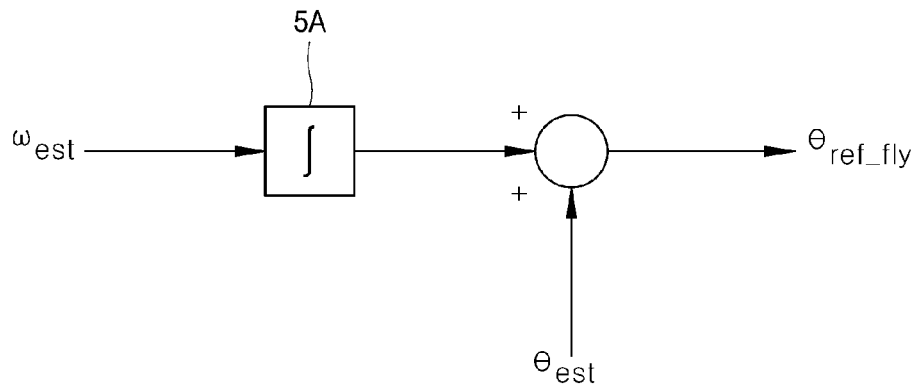

FIGS. 4 and 5 are diagrams for conceptually illustrating a way of determining the magnitude and phase of a command voltage in the prior art.

As shown in FIGS. 4 and 5, the magnitude of the command voltage in the restart section is calculated by adding the magnitude of the input voltage $V_{mag}$ to the electric motor determined by the voltage magnitude and phase determining unit to the magnitude of the change in voltage versus time determined by a gradient determining unit 4A. The magnitude of the command voltage may be expressed in the following Equation:

$$V_{ref\_fly} = V_{mag} + a \cdot t \qquad \text{[Mathematical Expression 1]}$$

where a denotes change in voltage versus time.

In addition, the phase of the command voltage in the restart section may be calculated by adding the phase ($\theta_{est}$) of the input voltage to the electric motor to the phase of a time integral of frequency of input voltage to the electric motor, which is determined by the voltage magnitude and phase determining unit, by an integration unit 5A. The phase of the command voltage may be expressed in the following Equation:

$$\theta_{ref\_fly} = \theta_{est} + \int \omega_{est} dt \qquad \text{[Mathematical Expression 2]}$$

Figure 6:
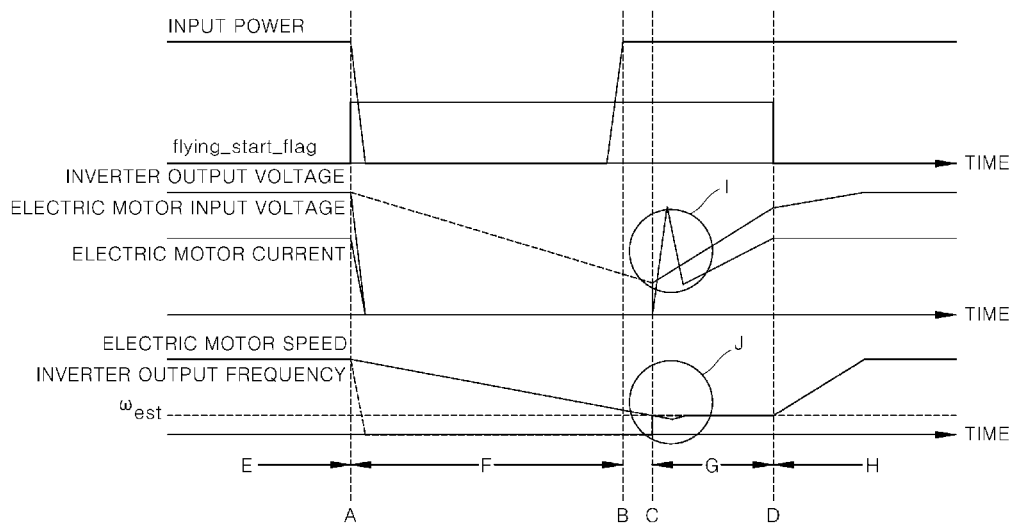
FIG. 6 is a graph for illustrating a sequence of restarting an inverter in the prior art.

FIG. 6 is a graph for illustrating a sequence of restarting an inverter in the prior art. The sequence of restarting an inverter is carried out using the magnitude and phase of the command voltage determined according to the way illustrated in FIGS. 4 and 5.

As can be seen from FIG. 6, an input power supplied from a power supply is interrupted at time point A and is restored at time point B. Even though the input power is restored at time point B, however, the electric motor restarts at time point C after some time interval and is operated normally after time point D, as shown in FIG. 6. That is, the electric motor is operated normally in sections E and H, abnormality occurs in an input power in section F, and the electric motor restarts in section G.

When the phase of the restart command voltage determined as in FIG. 5 is used, variation in frequency dependent on a load is not considered. Accordingly, there is a problem in that a difference J takes place between the speed of the electric motor and the output frequency of the inverter due to a slip frequency caused by a load, such that an inrush current I occurs in the input current to the electric motor at the time of restarting.

To overcome the problem, the control unit 40 implemented as an apparatus for controlling an inverter according to an exemplary embodiment of the present disclosure compensates for the frequency dependent on a load estimated based on the frequency of measured phase-currents or line voltages of an electric motor in free rotation, and determines the phase of an command voltage of the inverter 2 accordingly. As a result, the magnitude of the phase-currents of the electric motor possibly occurring at the time of restarting can be reduced, such that the electric motor can be restarted stably.

Figure 7:
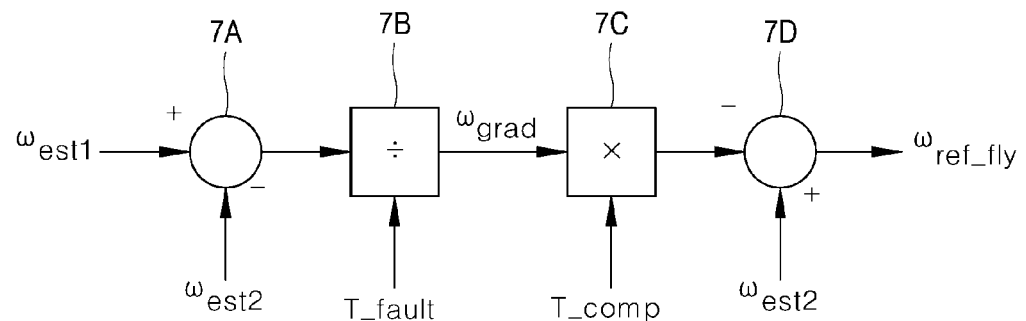
FIG. 7 is a diagram for illustrating a way of determining the frequency of a command voltage in a restart section according to an exemplary embodiment of the present disclosure.
Figure 8:
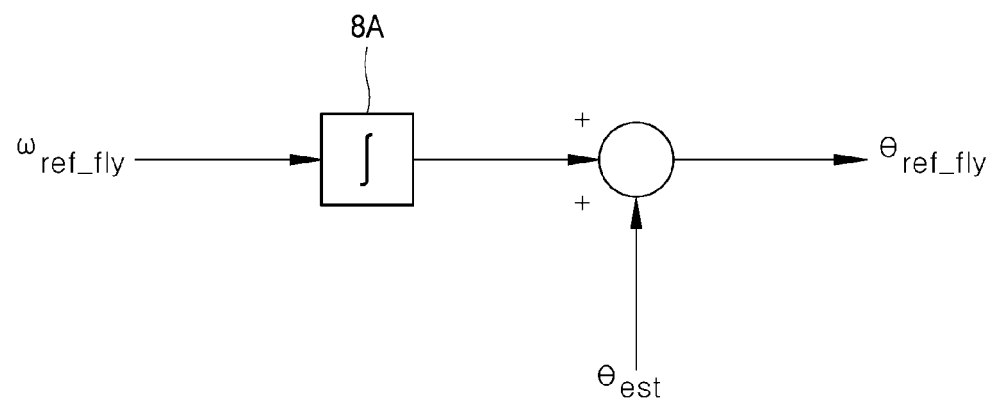
FIG. 8 is a diagram for illustrating a way of determining the phase of an command voltage in a restart range according to an exemplary embodiment of the present disclosure.
Figure 9:
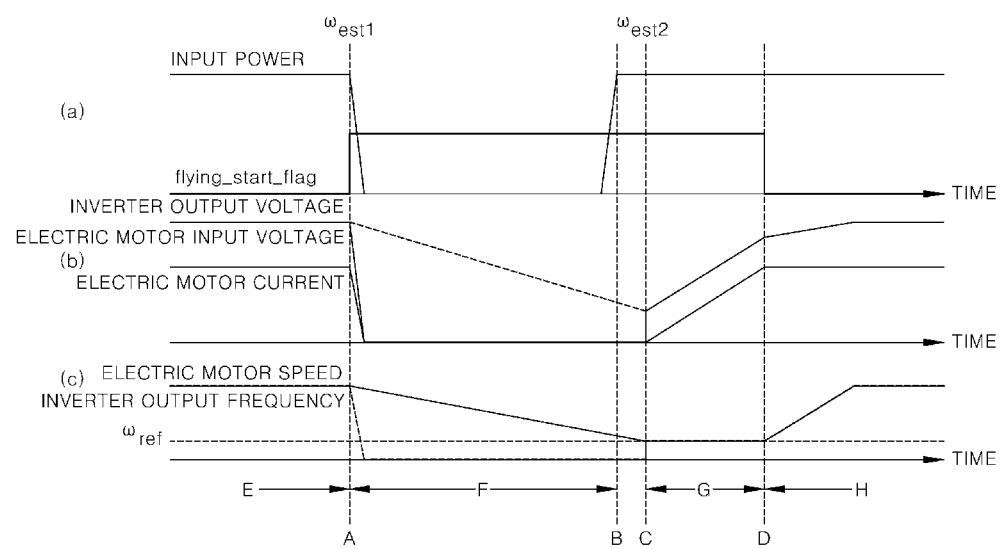
FIG. 9 is a graph for illustrating a sequence of restarting an inverter according to the exemplary embodiment of the present disclosure.

FIG. 7 is a diagram for illustrating a way of determining the frequency of an command voltage in a restart section according to an exemplary embodiment of the present disclosure. FIG. 8 is a diagram for illustrating a way of determining the phase of an command voltage in a restart section according to an exemplary embodiment of the present disclosure. FIG. 9 is a graph for illustrating a sequence of restarting an inverter according to the exemplary embodiment of the present disclosure. The same reference numerals as those in FIG. 6 are used in FIG. 9 for easy comparison with the prior art.

As can be seen from FIG. 9, an input power supplied from a power supply 1 (in FIG. 1) is interrupted at time point A and is restored at time point B. Even though the input power is restored at time point B, the electric motor restarts at time point C after some time interval and is operated normally after time point D, as shown in FIG. 6. That is, the electric motor is operated normally in sections E and H, abnormality occurs in input power in section F, and the electric motor restarts in section G. The restart section refers to a time period from when the inverter restarts to when the inverter restores its rated voltage or greater.

As shown in FIG. 7, the restart command voltage determining unit 43 (in FIG. 3) may determine the frequency of the compensated command voltage $\omega_{ref\_fly}$ (hereinafter referred to as "command frequency"). As shown in FIG. 8, the phase of the restart command voltage may be determined using the determined command frequency.

Specifically, the restart command voltage determining unit 43 may receive from the voltage magnitude and phase determining unit 42 (in FIG. 3) a frequency $\omega_{est1}$ of the input voltage to the electric motor measured at time point A when an error takes place in an input power so that the normal operation is finished, and a frequency $\omega_{est2}$ of the input voltage to the electric motor measured at time point C when the electric motor restarts. To this end, the voltage magnitude and phase determining unit 42 may determine the frequency from the input voltage to the electric motor measured by the voltage detecting unit 30 (in FIG. 1) at time point A to provide it to the restart command voltage determining unit 43, and may determine the frequency from the input voltage to the electric motor measured by the voltage detecting unit 30 at time point C to provide it to the restart command voltage determining unit 43.

Then, the restart command voltage determining unit 43 may divide the error between two frequencies $\omega_{est1}$, $\omega_{est2}$ calculated by a subtraction unit 7A by a time T_fault between two time points by a division unit 7B, thereby determining a gradient of the decreasing frequency. The gradient $\omega_{grad}$ of the decreasing frequency is determined by the amount of a load. The larger the load is, the higher the gradient of the frequency, and the smaller the load is, the lower the gradient of the frequency. Accordingly, the change in frequency dependent upon a load may be approximated as follows:

$$\omega_{grad}=(\omega_{est1}-\omega_{est2})/T\_fault \quad \text{[Mathematical Expression 3]}$$

When an command voltage is generated for restarting, an induction machine operated with voltage/frequency (V/f) ratio requires a time period of approximately several tens to several hundreds msec in order to generate an appropriate torque. That is, different electric motors require different time periods for generating an appropriate torque. The exemplary embodiment of the present disclosure uses this as compensation value T_comp. Specifically, as the compensation value T_comp, a value in the range from one-fourth to one-third of the time constant of a rotor of an induction machine may be used.

In the restart command voltage determining unit 43, a multiplication unit 7C multiplies the frequency gradient by T_comp, and subtracts an output from the multiplication unit 7C from the frequency $\omega_{est2}$ of the input voltage to the electric motor measured at time point C in FIG. 9 when the subtraction unit 7D restarts. Accordingly, the frequency at the time when an appropriate torque is generated may be determined as the command frequency $\omega_{ref\_fly}$ as follows:

$$\omega_{ref\_fly}=\omega_{est2}-\omega_{grad}\cdot T\_comp \quad \text{[Mathematical Expression 4]}$$

The time constant of a rotor of an induction machine is defined as follows:

$$T_r=L_r/R_r \quad \text{[Mathematical Expression 5]}$$

The T_comp in the mathematical expression 4 is determined taking into account the time constant of the rotor in Mathematical Expression 5, where Lr denotes rotor inductance of an induction machine, and Rr denotes rotor resistance.

Once the command frequency is determined in this manner, the restart command voltage determining unit 43 may determine the phase as shown in FIG. 8. That is, the phase of the command voltage in the restart section may be determined by adding the phase ($\theta_{est}$) of the input voltage to the electric motor to the phase of the command frequency $\omega_{ref\_fly}$ integrated by the integration unit 8A. The phase of the command voltage may be expressed in the following Equation:

$$\theta_{ref\_fly}=\theta_{est}+\int \omega_{ref\_fly}dt \quad \text{[Mathematical Expression 6]}$$

Referring to FIG. 9, a flag setting unit 45 may set a flag to 1 at time point A when an error takes place in an input power as shown in (a), and may set the flag to 0 at time point D when the restart section ends.

When an error takes place in an input power, the inverter 2 is interrupted for protection. Accordingly, the output voltage from the inverter becomes 0 immediately as shown in (b), and the voltage detecting unit 30 may measure an input voltage to the electric motor at time point A and the voltage magnitude and phase determining unit 42 may determine the frequency of the input voltage.

The input voltage to the electric motor 3 measured in section F where an error takes place in the input power is an induced electromotive force of the electric motor 3. The magnitude of the input voltage to the electric motor 3 and the speed of the electric motor decrease according to a load and the time constant of the electric motor 3 and do not form a path for electric motor current. Accordingly, the output current from the electric motor 3 is 0.

When an input power is applied again at time point B, the voltage magnitude and the phase determining unit 42 determines the magnitude, the phase and the frequency of the input voltage to the electric motor 3 by the measurement of the voltage measuring unit 30 at time point C after a time interval from time point B. The inverter 2 may restart based on the magnitude of the restart command voltage, the phase of the command voltage and the command frequency determined by the restart command voltage determining unit 43. In section G where the electric motor restarts, the command voltage determined by the restart command voltage determining unit 43 may be provided to the inverter 2.

That is, the magnitude of the restart command voltage may be determined by adding the magnitude $V_{mag}$ of the input voltage to the electric motor at the time of restarting to the magnitude of the change in voltage versus time.

In addition, the phase of the restart command voltage may be determined by adding the phase ($\theta_{est}$) of the input voltage to the electric motor at the time of restarting to the phase of time integral of the command frequency, which is obtained by subtracting the gradient of decreasing frequency versus time ($\omega_{grad}$) multiplied by the time for generating a torque from the frequency at the time of restarting.

In other words, the magnitude of the command voltage applied to the inverter 2 at time point D, i.e., the time of restarting, may be the magnitude of the input voltage to the electric motor. The phase of the command voltage may be the phase ($\theta_{est}$) of the input voltage to the electric motor. The phase of the command voltage in section G, i.e., restart section, may be calculated by using the command frequency, which is obtained by subtracting the gradient of decreasing frequency versus time ($\omega_{grad}$) multiplied by the time for generating a torque from the frequency at the time of restarting Section G, i.e., the restart section, ends at time point D when the output voltage from the inverter reaches a predetermined magnitude, and a flag may be set to 0. By doing so, the selecting unit 46 provides the command voltage determined by the command voltage determining unit 44 to the inverter 2, such that the inverter 2 may be normally operated.

In addition, as the output frequency of the inverter, the same frequency as that determined by the voltage magnitude and phase determining unit 42 has determined at time point C is applied in section G. The output frequency of the inverter may increase according to the voltage-frequency relationship after time point D.

As a result, according to the apparatus for controlling an inverter according to the exemplary embodiment of the present disclosure, it can be seen that inrush current is removed from the electric motor current in the restart section. In addition, unlike FIG. 6, the speed of the electric motor 3 and the output frequency of the inverter 2 are almost coincident with each other over the entire operation sections, as can be seen from (c) of FIG. 9. According to the exemplary embodiment of the present disclosure, the apparatus for controlling an inverter can compensate for an error corresponding to a slip frequency possibly occurring for generating a torque dependent on a load, such that the slip frequency can be small. As a result, the amplitude of current required for restating can be reduced.

According to the exemplary embodiments of the present disclosure, an inverter can be restarted stably by compensating for an error corresponding to a slip frequency for generating a torque dependent on a load in an output frequency of an electric motor at the time of restarting to thereby prevent an inrush current to the electric motor.

Although the exemplary embodiments of the present disclosure have been described in detail, these are merely illustrative. It will be appreciated by those skilled in the art that various modifications and equivalents are possible without departing from the scope of the present disclosure. Accordingly, the true scope of the present disclosure sought to be protected is defined only by the appended claims.

What is claimed is:

1. An apparatus for controlling an inverter employed in an inverter system, the apparatus comprising:
 a first determining unit configured to determine a frequency of an input voltage to an electric motor when an input power is reduced below a rated power, and to determine a magnitude, a phase and a frequency of the input voltage to the electric motor at the time of restarting if the input power is restored;
 a second determining unit configured to determine an command voltage to apply it to the inverter in a restart section after the time of restarting until an output voltage from the inverter reaches a predetermined output voltage;
 at least one power cell driving the electric motor; and
 a control unit controlling the inverter in response to at least an output of the second determining unit, by applying a voltage to the power cell
 wherein the second determining unit is further configured to determine a command frequency at the time when an appropriate torque is generated based on the frequency of the input voltage to the electric motor when the input power is reduced below the rated power, the frequency of the input voltage to the electric motor at the time of the restarting and a compensation value which is a time period required for generating the appropriate torque, and to determine a phase of the command voltage in the restart section based on the phase of the input voltage to the electric motor at the time of the restarting and the command frequency.

2. The apparatus of claim 1, further comprising:
 a voltage detecting unit configured to measure the input voltage to the electric motor; and
 a transforming unit configured to transform the input voltage to the electric motor measured by the voltage detecting unit into d-axis and q-axis voltage components in a synchronous coordinate system and provide it to the first determining unit.

3. The apparatus of claim 1, wherein the second determining unit is configured to determine a gradient of a decreasing frequency between the time of restarting and a time point when the input power is decreased below a rated power, and to determine the command frequency by subtracting a value multiplied the gradient of the decreasing frequency by the compensation value from the frequency of the input voltage to the electric motor at the time of restarting.

4. The apparatus of claim 3, wherein the compensation value is determined in a range from one-fourth to one-third of a time constant of the electric motor.

5. The apparatus of claim 3, wherein the second determining unit is configured to determine the phase of the command voltage in the restart section by adding a time integral of the command frequency to the phase of the input voltage to the electric motor at the time of restarting.

6. The apparatus of claim 1, wherein the second determining unit is configured to determine the magnitude of the command voltage at the time of restarting to be coincident with the magnitude of the input voltage to the electric motor at the time of restarting.

7. The apparatus of claim 6, wherein the second determining unit is configured to determine the magnitude of the command voltage in the restart section by adding a predetermined voltage change versus time to the magnitude of the input voltage to the electric motor at the time of restarting.

* * * * *